United States Patent
Ozasa et al.

(10) Patent No.: US 6,552,402 B1
(45) Date of Patent: Apr. 22, 2003

(54) COMPOSITE MOS TRANSISTOR DEVICE

(75) Inventors: Masayuki Ozasa, Kyoto (JP); Tatsuo Okamoto, Cupertino, CA (US); Hidehiko Kurimoto; Shiro Dosho, both of Osaka (JP); Kazuhiko Nagaoka, Kyoto (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/287,310

(22) Filed: Apr. 7, 1999

(30) Foreign Application Priority Data

Apr. 9, 1998 (JP) .......................... 10-097242

(51) Int. Cl.[7] .............................. H01L 29/76
(52) U.S. Cl. ................ 257/390; 257/206; 257/390; 257/393; 257/401
(58) Field of Search ............................ 257/390, 393, 257/401, 206

(56) References Cited

U.S. PATENT DOCUMENTS 5,652,457 A * 7/1997 Ikeda et al. ................ 257/380

(List continued on next page.)

FOREIGN PATENT DOCUMENTS

| JP | 48-95194 | 12/1973 |
| JP | 48-095194 | 12/1973 |
| JP | 56-134756 | 10/1981 |
| JP | 57-198652 | 12/1982 |
| JP | 360037158 | * 2/1985 | .................. 257/390 |
| JP | 401031456 | * 2/1985 | .................. 257/390 |
| JP | 62-150779 | 7/1987 |
| JP | 4-73961 | 3/1992 |
| JP | 5-90516 | 4/1993 |
| JP | 8-8264 | 1/1996 |

OTHER PUBLICATIONS

Phillip E. Allen et al., "CMOS Analog Circuit Design" Saunders College Publishing, Harcourt Brace, Jovanovich College Publishers, pp. 332–335.

Notice of Reasons of Rejection issued on Jun. 6, 2000 for a counterpart Japanese Application and English translation.

Decision of Rejection, Patent Application No. 11–099246, Drafted: Dec. 22, 2000 "Composite MOS Transistor Device".

*Primary Examiner*—George Eckert
*Assistant Examiner*—Edgardo Ortiz
(74) *Attorney, Agent, or Firm*—Donald R. Studebaker; Nixon Peabody LLP

(57) ABSTRACT

A composite MOS transistor device for a semiconductor integrated circuit includes at least a pair of MOS transistors, or first and second MOS transistors, placed on the same board. The first and second MOS transistors are made up of first and second groups of equally divided transistors with an equal gate width, respectively. These divided transistors are arranged in parallel to each other in the gate longitudinal direction. The divided transistors of these groups are arranged such that the sum of coordinates of respective gates, measured from a centerline, is equalized between these groups along the gate longitudinal direction. Since the sum of errors of respective gates along the length thereof becomes zero in each group of divided transistors, the current difference between the two MOS transistors can be eliminated. Accordingly, in forming a differential amplifier or a current mirror circuit using this MOS transistor pair, high current gain can be obtained while maintaining an adequate balance in output current.

10 Claims, 7 Drawing Sheets

U.S. PATENT DOCUMENTS

| | | | | |
|---|---|---|---|---|
| 5,691,574 A | * | 11/1997 | Suzuki | 257/758 |
| 5,721,698 A | * | 2/1998 | Lee et al. | 365/104 |
| 5,804,854 A | * | 9/1998 | Jung et al. | 257/321 |
| 5,930,663 A | * | 7/1999 | Baukus et al. | 438/598 |
| 5,952,698 A | * | 9/1999 | Wong et al. | 257/401 |
| 5,990,525 A | * | 9/1999 | Liao | 257/390 |
| 5,990,526 A | * | 11/1999 | Bez et al. | 257/390 |
| 5,998,846 A | * | 12/1999 | Jan et al. | 257/401 |

* cited by examiner

US 6,552,402 B1

COMPOSITE MOS TRANSISTOR DEVICE

BACKGROUND OF THE INVENTION

The present invention relates to a composite MOS transistor device, including at least a pair of MOS transistors, for a semiconductor integrated circuit, and also relates to an operational amplifier as an exemplary embodiment of the composite MOS transistor device including the MOS transistor pair.

FIG. 10 illustrates a mask layout for a conventional MOS transistor pair. As shown in FIG. 10, a first MOS transistor M1 is paired with a second MOS transistor M2. The first MOS transistor M1 includes gate G1, source S and drain D1. Similarly, the second MOS transistor M2 also includes gate G2, source S and drain D2. The MOS transistor pair shown in FIG. 10 is applicable to a pair of differential transistors shown in FIG. 6 and a pair of current mirror transistors shown in FIG. 7, for example. In FIGS. 6 and 7, B denotes a board. In the pair of differential transistors or current mirror transistors, the source is connected in common because of the circuit configuration thereof. Accordingly, as in a mask layout shown in FIG. 11, a single source may be shared between the first and second MOS transistors M1 and M2 of FIG. 10. FIG. 12 illustrates an example where the gate width of each of the first and second MOS transistors M1 and M2 is divided into three and where the divided transistors are arranged in parallel to each other in the gate longitudinal direction. As shown in FIG. 12, the first MOS transistor M1 is constructed from three divided transistors M1$a$, M1$b$ and M1$c$, each of which includes gate G1, source S and drain D1. The divided transistor M1$b$, located at the center, shares its drain and source with the drain of the divided transistor M1$a$ and the source of the divided transistor M1$c$, respectively, on the right- and left-hand sides thereof. Similarly, the second MOS transistor M2 is also constructed from three divided transistors M2$a$, M2$b$ and M2$c$, each of which includes gate G2, source S and drain D2. The divided transistor M2$b$, located at the center, shares its source and drain with the source of the divided transistor M2$a$ and the drain of the divided transistor M2$c$, respectively, on the left- and right-hand sides thereof.

Conventional MOS transistor pairs of another type for semiconductor integrated circuit are disclosed, for example, in Japanese Laid-Open Publications Nos. 4-73961 and 5-90516. In the MOS transistor pair of this type, two pairs of transistors M1$a$ & M1$b$ and M2$a$ & M2$b$, formed by dividing the gate width of each of first and second MOS transistors into two, are arranged diagonally, i.e., symmetrically about a point, as shown in FIG. 13.

A conventional MOS transistor pair of still another type is disclosed, for example, in Japanese Laid-Open Publication No. 2-12929. In the MOS transistor pair, two groups of transistors M1$a$ through M1$e$ and M2$a$ through M2$e$, formed by dividing each of first and second MOS transistors into five, are arranged regularly and alternately as shown in FIG. 14.

In constructing a differential amplifier or a current mirror circuit from a pair of MOS transistors for a semiconductor integrated circuit, high current gain should be obtained while maintaining an adequate balance in output current.

However, in a conventional MOS transistor pair of any of these types, current flowing through a first MOS transistor may be greatly different from that flowing through a second MOS transistor or has low current gain. Hereinafter, this drawback will be described in greater detail.

In general, a current value of an MOS transistor is given by $$Id = k \cdot W(Vgs-Vth)^2/(2 \cdot L)$$

where Id is drain current of the MOS transistor, k is a current amplification factor of the transistor, W is the gate width of the transistor, Vgs is a gate-to-source voltage, Vth is the threshold voltage of the transistor and L is the gate length of the transistor.

The current balance between the first and second MOS transistors M1 and M2 in each of the MOS transistor pairs shown in FIGS. 10 and 11 will be considered. Since these MOS transistors M1 and M2 are not located at the same position on a chip, respective gate sizes of one of these transistors M1 and M2 may be different from those of the other because of various factors during the manufacturing process thereof. Herein, the width W and length L of the gate of the first MOS transistor M1 are supposed to be standard ones, and the respective differences in width and length between the first and second MOS transistors M1 and M2 are denoted by DW and DL, respectively. In such a case, the drain current Id of the second MOS transistor M2 is given by $$Id = k \cdot W(1+DW/W)(Vgs-Vth)^2/\{2 \cdot L(1+DL/L)\}$$

Next, according to first-order approximation with DW/W and DL/L both supposed to be smaller than 1, the difference DId in drain current Id between the first and second MOS transistors M1 and M2 is given by $$DId = Id(DW/W - DL/L)$$

This current difference leads to deterioration in performance of a circuit and decrease in yield of a semiconductor integrated circuit. In order to avoid such a situation, the MOS transistor pairs shown in FIGS. 10 and 11 are designed to have respective gate widths W and lengths L of large sizes. However, if the gate length L of an MOS transistor is increased, then the current can be amplified less by the transistor. Nevertheless, if the gate width W is further increased to compensate for such a low amplification factor, then the MOS transistor pair occupies a larger area on a semiconductor integrated circuit.

In the MOS transistor pair shown in FIG. 12, only the gate width W thereof is designed at a large size. However, the current difference between both transistors, resulting from the difference in gate length L, cannot be eliminated. In this case, the current difference between the two transistors M1 and M2 of the MOS transistor pair shown in FIG. 12 can be calculated as follows. The size precision of an MOS transistor in the gate longitudinal direction is approximately proportional to the distance from the centerline X–X' shown in FIG. 12. Each transistor is herein divided into three. Thus, supposing the difference in gate length in a region closer to the centerline X–X' is denoted by DL and the current value of each divided transistor is denoted by Idd, the current difference DId between these MOS transistors M1 and M2 is given by the sum of currents of the three equally divided transistors:

$$DId = Idd[\{(DL+2DL+3DL)-(-DL-2DL-3DL)\}/L] = Id(12DL/L)/3 = 4Id \cdot DL/L$$

Thus, the current difference is large.

Similarly, the current difference between the two transistors cannot become zero in the MOS transistor pair shown in FIG. 14, either. In this case, the current difference between these two transistors can be calculated as follows. Each transistor is herein divided into five. Thus, the current difference DId between these MOS transistors M1 and M2 is given by $$DId=Idd[\{(-4.5DL-0.5DL-1.5DL+2.5DL+3.5DL)-(4.5DL+1.5DL+0.5DL-2.5DL-3.5DL)\}/L]=-Id(DL/L)/5=-Id/5\cdot DL/L$$

Thus, the current difference does not become zero, either.

In the MOS transistor pair shown in FIG. 13, the transistors are arranged symmetrically about a point, and an adequate balance can be advantageously maintained between currents. However, since the gate length L is longer than usual, the current cannot be amplified satisfactorily. In addition, two pairs of divided transistors are arranged diagonally. Accordingly, if an interconnect, connecting together the gates of one pair of divided transistors M1a and M1b, is routed preferentially, then the interconnect, connecting together the gates of the other pair of divided transistors M2a and M2b, should be routed so as not to overlap with the former interconnect. As a result, the routing process is adversely complicated and the total area occupied by these interconnects increases. In order to avoid such a situation, two interconnection layers should be provided.

SUMMARY OF THE INVENTION

An object of the present invention is providing a composite MOS transistor device that can obtain high gain while maintaining an adequate balance in output current.

To achieve this object, in a composite MOS transistor device according to the present invention, each of a pair of MOS transistors is made up of a plurality of equally divided transistors with an equal gate width. These divided transistors are laid out in such a manner as to minimize the sum of errors in the gate longitudinal direction, thereby reducing or eliminating the current difference caused between these MOS transistors.

A composite MOS transistor device according to the present invention includes at least a pair of MOS transistors. The MOS transistor pair consists of first and second MOS transistors placed on the same board. The first and second MOS transistors are made up of first and second groups of divided transistors, respectively, which are arranged in parallel to each other in the gate longitudinal direction. The divided transistors of the first group are arranged to alternate with the divided transistors of the second group such that a sum of respective gate lengths is equalized between the first and second groups of divided transistors.

Another composite MOS transistor device according to the present invention includes at least a pair of MOS transistors. The MOS transistor pair consists of first and second MOS transistors placed on the same board. The first and second MOS transistors are made up of first and second groups of divided transistors, respectively, which are arranged in parallel to each other in the gate longitudinal direction. The first and second MOS transistors are arranged such that a sum of coordinates of respective gates is equalized between the first and second groups of divided transistors when measured from a predetermined reference coordinate along the gate longitudinal direction.

In one embodiment of the present invention, the divided transistors of the first group are arranged to alternate with the divided transistors of the second group.

In another embodiment of the present invention, the divided transistors of the first and second groups are arranged symmetrically about the same line to form the first and second MOS transistors, respectively.

Still another composite MOS transistor device according to the present invention includes: an MOS transistor pair consisting of first and second MOS transistors placed on the same board and constructing a current mirror circuit; and a third MOS transistor functioning as an output transistor. The first, second and third MOS transistors are made up of first, second and third groups of divided transistors, respectively, which are arranged in parallel to each other in the gate longitudinal direction. The first, second and third MOS transistors are arranged such that a sum of coordinates of respective gates is equalized among the first, second and third groups of divided transistors when measured from a predetermined reference coordinate along the gate longitudinal direction.

In one embodiment of the present invention, the divided transistors of the first, second and third groups are arranged symmetrically about the same line to form the first, second and third MOS transistors, respectively.

According to the present invention, a plurality of divided transistors of respective groups are arranged such that a sum of errors of respective gates is equalized among these groups or becomes zero in the gate longitudinal direction. Accordingly, the current difference caused between MOS transistors can be reduced or totally eliminated. In addition, since each MOS transistor is made up of a plurality of divided transistors with an equal gate width, the gate length of each divided transistor gets longer. As a result, a large amount of drain current flows through each divided transistor and the current can be ultimately amplified to a large degree.

Consequently, a MOS transistor pair that can obtain a high current gain while maintaining an adequate balance in output current is realized. And an operational amplifier with a less variable offset can be obtained using this MOS transistor pair.

DESCRIPTION OF THE PREFERRED EMBODIMENTS

Hereinafter, preferred embodiments of the present invention will be described with reference to the drawings.

Embodiment 1

Figure 1:
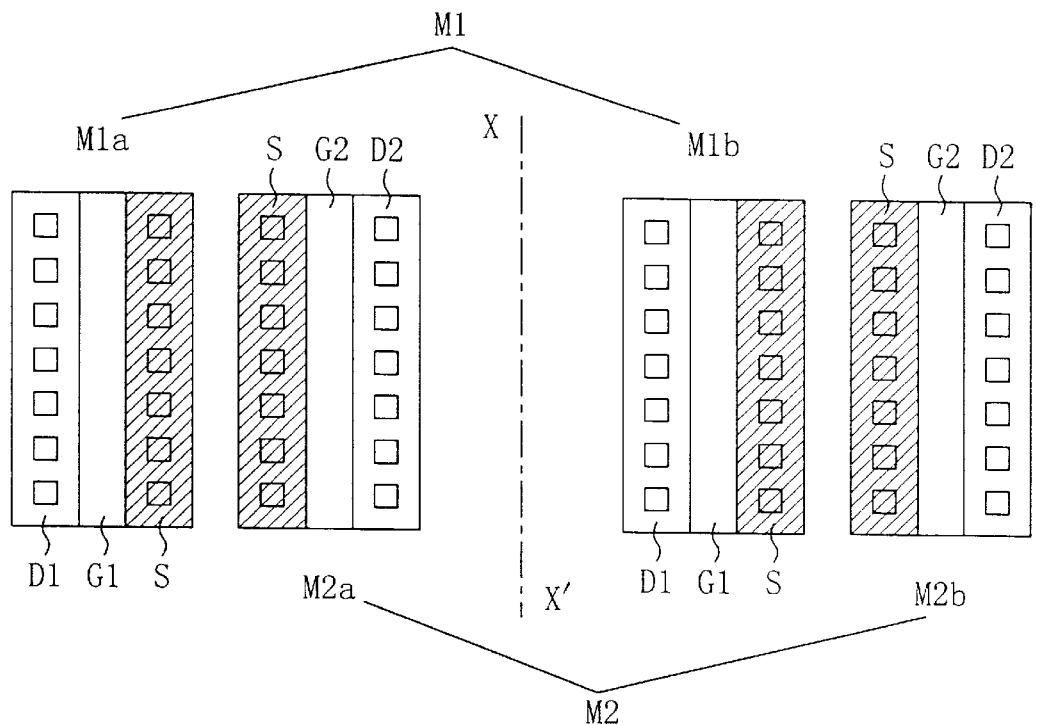
FIG. 1 illustrates a mask layout for an MOS transistor air according to the first embodiment of the present invention.

FIG. 1 illustrates a mask layout for an MOS transistor pair according to the first embodiment of the present invention. As shown in FIG. 1, first and second MOS transistors M1 and M2 are placed on the same board. The first MOS transistor M1 is divided into two equal parts with an equal gate width, thereby forming two divided transistors (i.e., a first group of divided transistors) M1a and M1b. And these parts are arranged in parallel to each other in the gate longitudinal direction. Similarly, the second MOS transistor M2 is also divided into two equal parts with an equal gate width, thereby forming two divided transistors (i.e., a second group of divided transistors) M2a and M2b. And these parts are also arranged in parallel to each other in the gate longitudinal direction. Each of these divided transistors M1a, M1b, M2a or M2b includes gate G1 or G2, source S and drain D1 or D2.

The sum of gate lengths of one pair of divided transistors M1a and M1b is equal to the sum of gate lengths of the other pair of divided transistors M2a and M2b. Also, these four divided transistors M1a, M1b, M2a and M2b are arranged about a centerline X–X' of the MOS transistor pair as follows. One divided transistor M2a of the second MOS transistor M2 is placed on the left of the centerline X–X', and one divided transistor M1a of the first MOS transistor M1 is placed on the left of the divided transistor M2a. The other divided transistor M1b of the first MOS transistor M1 is placed on the right of the centerline X–X', and the other divided transistor M2b of the second MOS transistor M2 is placed on the left of the divided transistor M1b. In other words, these four divided transistors are arranged in such a manner that the divided transistors of the first MOS transistor M1 are arranged to alternate with those of the second MOS transistor M2. Also, the distance from the centerline X–X' to the divided transistor M1a of the first MOS transistor M1 is equal to that from the centerline X–X' to the divided transistor M2b of the second MOS transistor M2. In the same way, the distance from the centerline X–X' to the divided transistor M2a of the second MOS transistor M2 is equal to that from the centerline X–X' to the divided transistor M1b of the first MOS transistor M1. Thus, the sum of coordinates of respective gates of the two divided transistors M1a and M1b of the first MOS transistor M1 is equal to that of the two divided transistors M2a and M2b of the second MOS transistor M1 along the length thereof.

In the MOS transistor pair having such a configuration, the current difference between the two MOS transistors M1 and M2 can be calculated as follows. The size precision of each MOS transistor in the gate longitudinal direction is approximately proportional to the distance from the centerline X–X'. Thus, supposing the difference in gate length in a region closer to the centerline X–X' is denoted by DL, the current difference between these transistors M1 and M2 is given by $$DId=Idd\{(-DL+2DL)-(DL-2DL)\}/L\}=Id\cdot(2DL/L)/2=Id\cdot DL/L$$

Figure 12:
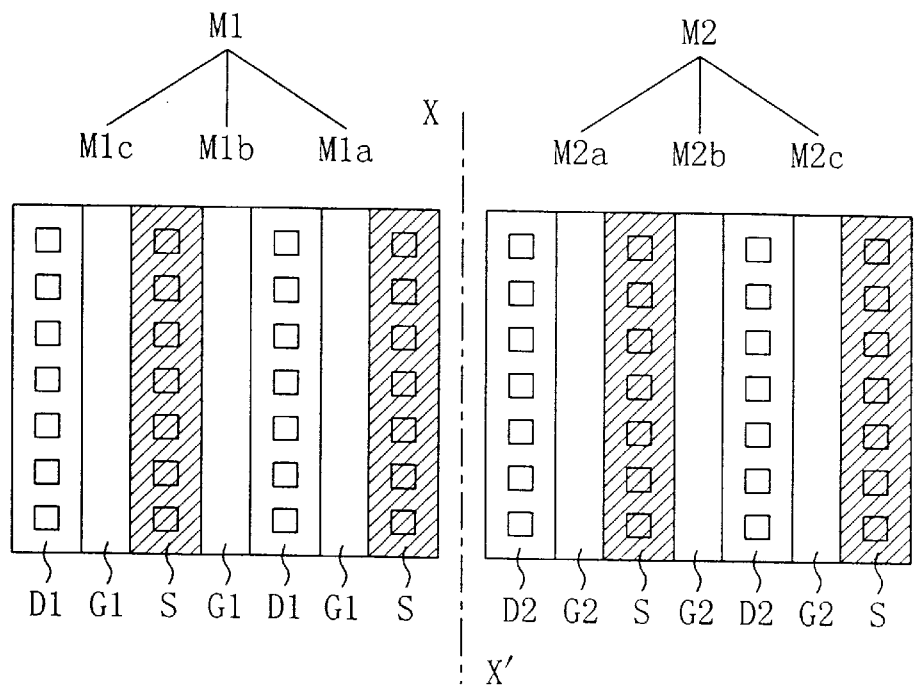
FIG. 12 illustrates a mask layout for still another conventional MOS transistor pair.

Thus, the current difference is smaller than that of the MOS transistor pair shown in FIG. 12.

Figure 2:
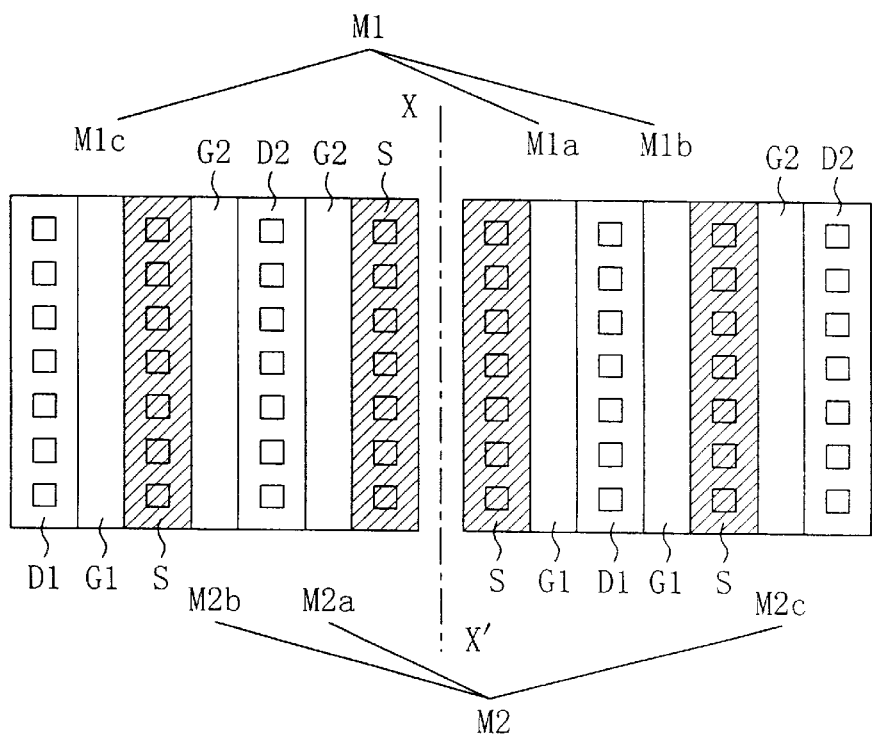
FIG. 2 illustrates an exemplary modified mask layout for the MOS transistor pair of the first embodiment.

FIG. 2 illustrates a modified example of the MOS transistor pair shown in FIG. 1. As shown in FIG. 2, the first MOS transistor M1 is divided into three divided transistors sistors M1a, M1b and M1c. Similarly, the second MOS transistor M2 is also divided into three divided transistors M2a, M2b and M2c. The divided transistors M1c and M2b share the source S in common. The divided transistors M2b and M2a share the drain D2 in common. The divided transistors M1a and M1b share the drain D1 in common. And the divided transistors M1b and M2c share the source S in common.

In the first MOS transistor M1, the coordinate of the divided transistor M1a is supposed to be "+L0" regarding the centerline X–X' as a base line. Herein, the domain on the right of the centerline X–X' is supposed to be "+", while the domain on the left thereof "–". In such a case, the coordinates of the divided transistors M1b and M1c are "+2L0" and "–3L0", respectively. Similarly, in the second MOS transistor M2, the coordinates of the divided transistor M2a, M2b and M2c are "–L0", "–2L0" and "+3L0", respectively. Accordingly, the sum of respective coordinates "+L0", "+2L0" and "–3L0" of the three divided transistors M1a, M1b and M1c in the first MOS transistor M1 is zero. In the same way, the sum of respective coordinates "–L0", "–2L0" and "+3L0" of the three divided transistors M2a, M2b and M2c in the second MOS transistor M2 is also zero.

In the MOS transistor pair shown in FIG. 2, the current difference DId between the two MOS transistors M1 and M2 is $$DId=Idd\{(-DL-2DL+3DL)-(DL+2DL-3DL)\}/L=0$$

Thus, the current difference can be totally eliminated. In this mask layout, the sum of errors DL in gate lengths is zero and therefore the current difference is also zero. As a result, the output current balance between these two MOS transistors M1 and M2 is excellent.

Figure 10:
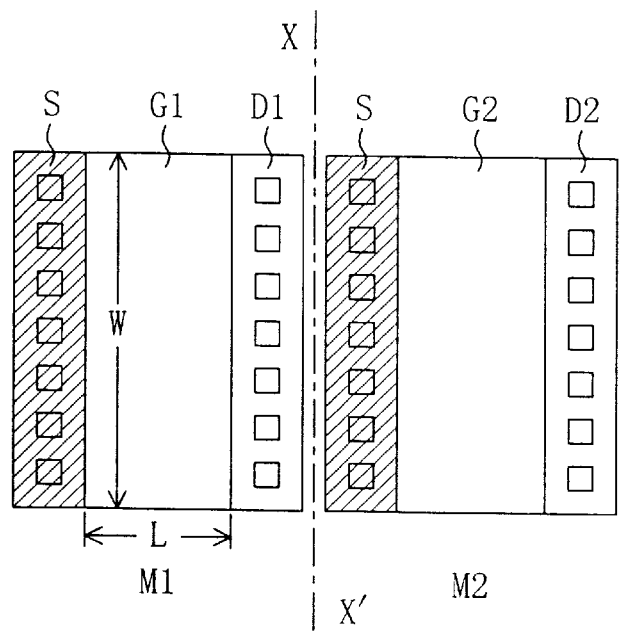
FIG. 10 illustrates a mask layout for a conventional MOS transistor pair.
Figure 11:
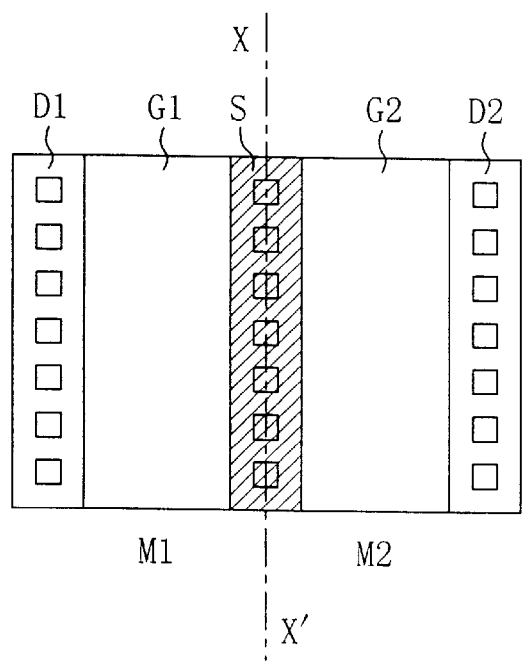
FIG. 11 illustrates a mask layout for another conventional MOS transistor pair.
Figure 13:
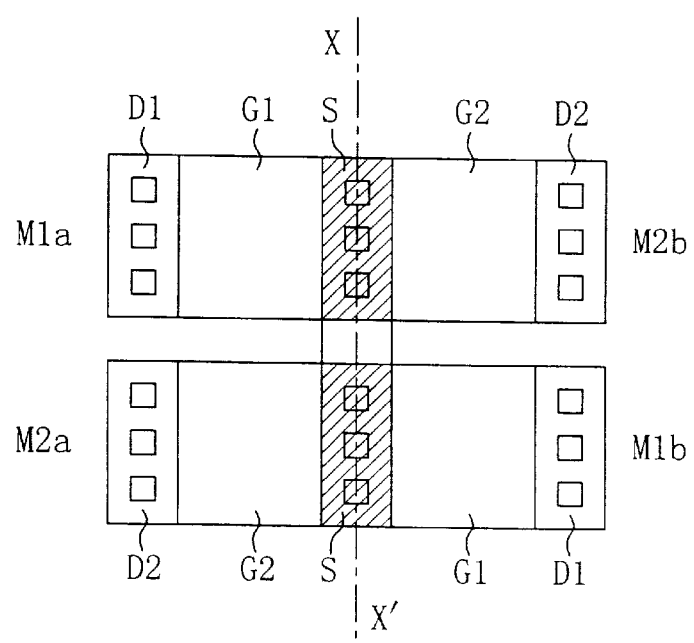
FIG. 13 illustrates a mask layout for yet another conventional MOS transistor pair.
Figure 14:
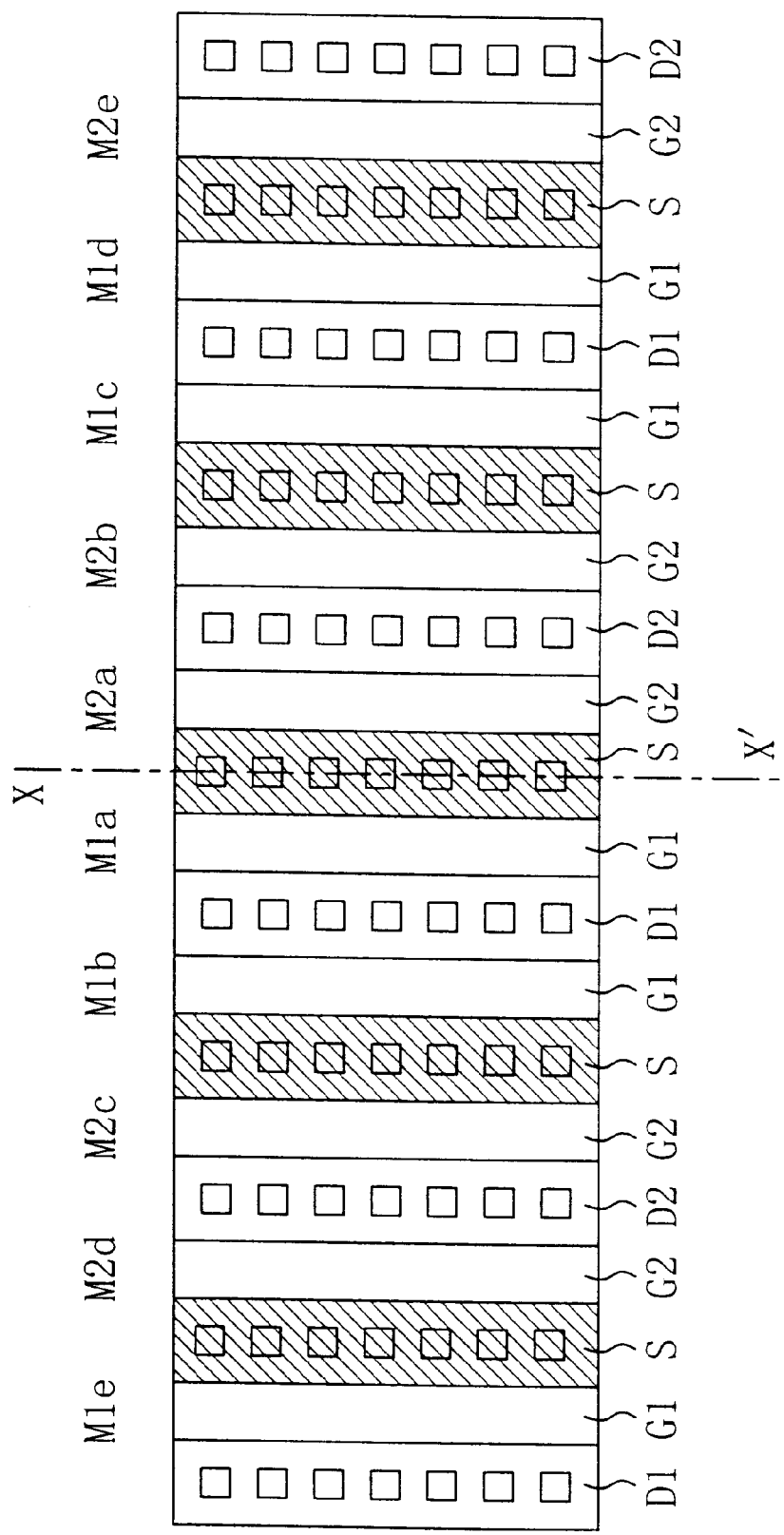
FIG. 14 illustrates a mask layout for yet another conventional MOS transistor pair.

In addition, the MOS transistor pair shown in FIG. 2 can utilize a gate length as large as the MOS transistor pair shown in FIG. 12, unlike the conventional examples shown in FIGS. 10, 11 and 13. Consequently, the MOS transistor pair can obtain high gain.

Furthermore, in the MOS transistor pair shown in FIG. 2, the total area of drains is equal between the first and second MOS transistors M1 and M2. Therefore, this layout is suitable for designing a differential MOS transistor pair.

Embodiment 2

Next, an MOS transistor pair according to the second embodiment of the present invention will be described.

Figure 3:
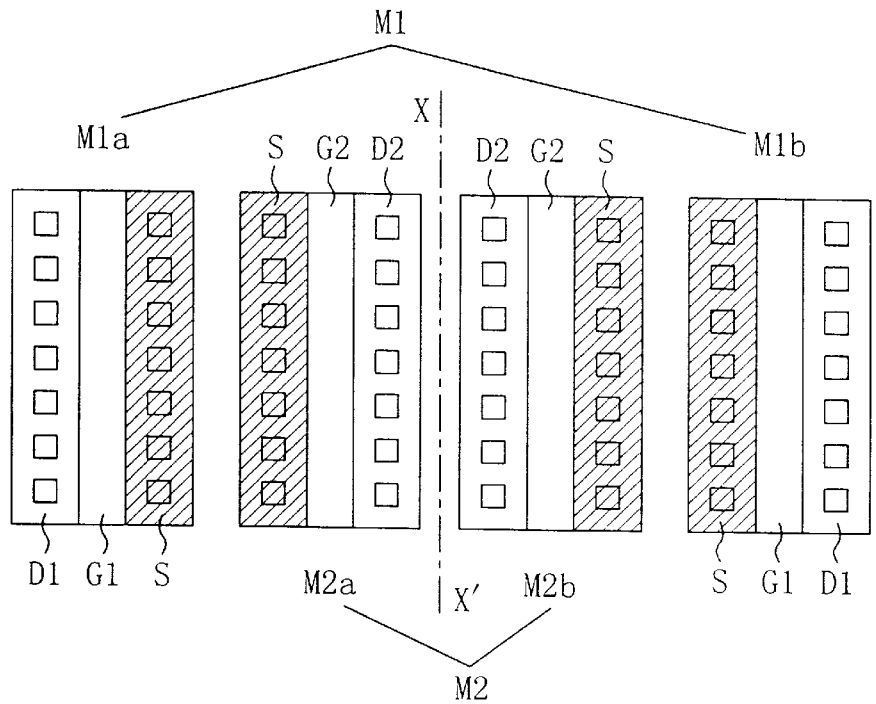
FIG. 3 illustrates a mask layout for an MOS transistor pair according to the second embodiment of the present invention.

FIG. 3 illustrates a mask layout for an MOS transistor pair of the second embodiment. As shown in FIG. 3, a first MOS transistor M1 is made up of two equally divided transistors M1a and M1b with an equal gate width. Similarly, a second MOS transistor M2 is also made up of two equally divided transistors M2a and M2b with an equal gate width. Each of these divided transistors M1a, M1b, M2a or M2b includes gate G1 or G2, source S and drain D1 or D2.

One divided transistor M2a of the second MOS transistor M2 is placed on the left of the centerline X–X', while the other divided transistor M2b thereof is placed on the right of the centerline. One divided transistor M1a of the first MOS transistor M1 is placed on the left of the divided transistor M2a, while the other divided transistor M1b thereof is placed on the right of the divided transistor M2b. That is to say, as can be seen from FIG. 3, the two divided transistors M1a and M1b of the first MOS transistor M1 are arranged symmetrically about the centerline X–X', and therefore the sum of coordinates of respective gates along the length thereof is zero. A similar statement applies to the two divided transistors M2a and M2b of the second MOS transistor M2.

In the MOS transistor pair having such a configuration, the current difference between the two MOS transistors M1 and M2 can be calculated as follows. As in the first embodiment, the size difference between these MOS transistors in the gate longitudinal direction is approximately proportional to the distance from the centerline X–X'. Thus, supposing the difference in gate length in a region closer to the centerline X–X' is denoted by DL, the current difference between these MOS transistors M1 and M2 is given by $$DId=Idd(((DL-DL)+(2DL-2DL))/L)=0$$

Thus, the current difference can be totally eliminated. As a result, the output current balance between these two MOS transistors M1 and M2 is excellent. In addition, the MOS transistor pair shown in FIG. 3 can utilize a gate length as large as the MOS transistor pair shown in FIG. 12, unlike the conventional examples shown in FIGS. 10, 11 and 13. Consequently, the MOS transistor pair can obtain high gain.

Figure 4:
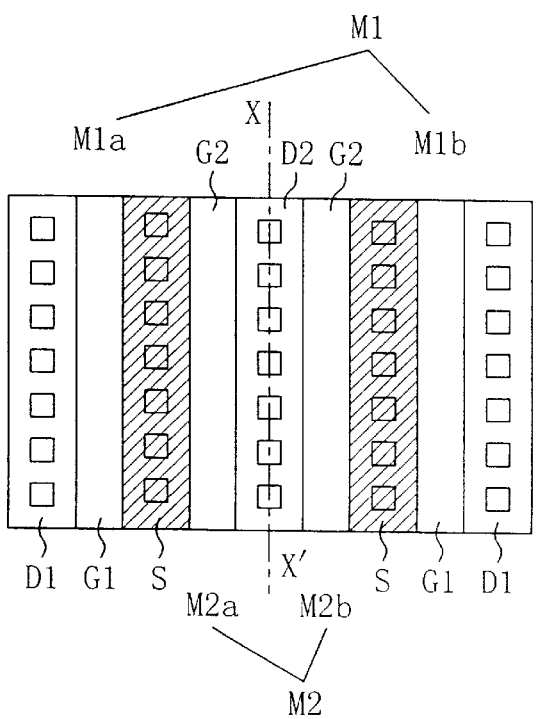
FIG. 4 illustrates an exemplary modified mask layout for the MOS transistor pair of the second embodiment.

FIG. 4 illustrates a modified example of the second embodiment. In this modified example, two divided transistors M1a and M2a share the source S in common, two divided transistors M2a and M2b share the drain D2 in common and two divided transistors M2b and M1b share the source S in common.

Accordingly, the size of this modified MOS transistor pair can be smaller than that of the MOS transistor pair of the second embodiment. That is to say, the difference DL in gate length itself can be reduced, thus further improving the balance in output current between these MOS transistors M1 and M2. Furthermore, the area of the drain in the second MOS transistor M2 is smaller than that of the drains in the first MOS transistor M1. Accordingly, if the second MOS transistor M2 is placed at the output end, then the frequency characteristics of the MOS transistor pair (current mirror circuit) can be improved at the output end thereof.

Figure 5:
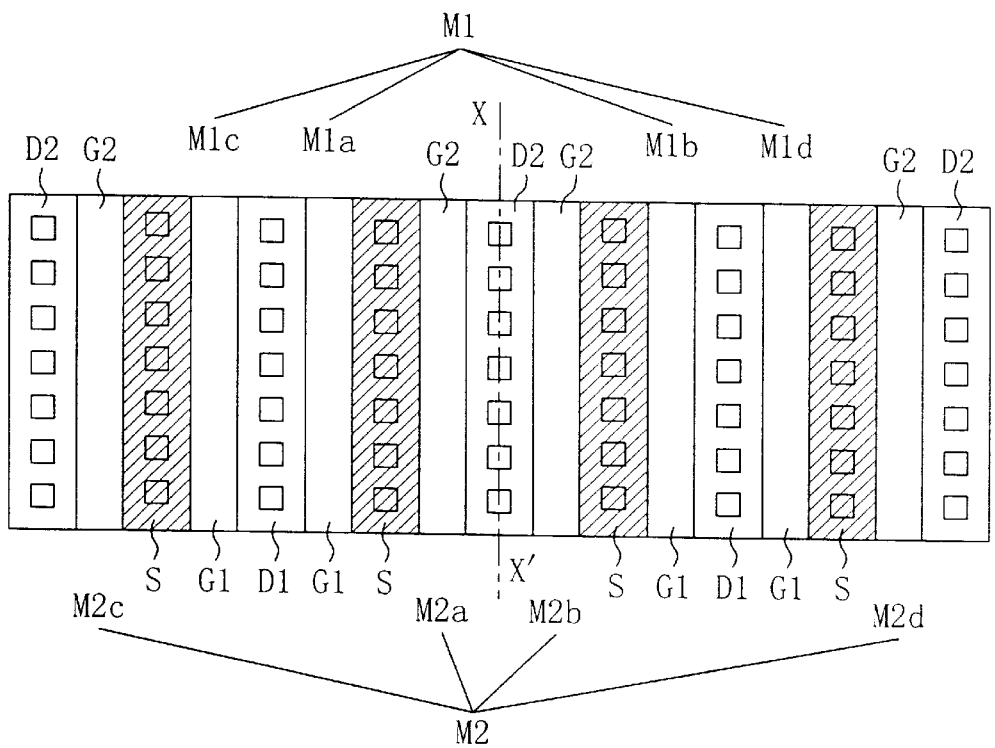
FIG. 5 illustrates another exemplary mask layout obtained by further modifying the layout shown in FIG. 4.

FIG. 5 illustrates a further modified example of the MOS transistor pair shown in FIG. 4. As shown in FIG. 5, the first MOS transistor M1 is divided into four divided transistors M1a through M1d. Similarly, the second MOS transistor M2 is also divided into four divided transistors M2a through M2d. Two out of the four divided transistors of the first MOS transistor M1, namely, M1c and M1d, are placed symmetrically about the centerline X–X'. Similarly, two out of the four divided transistors of the second MOS transistor M2, namely, M2c and M2d, are also placed symmetrically about the centerline X–X'. In addition, the source S and the drains D1 and D2 are shared in common among these divided transistors as in the modified example shown in FIG. 4.

Embodiment 3

Figure 9:
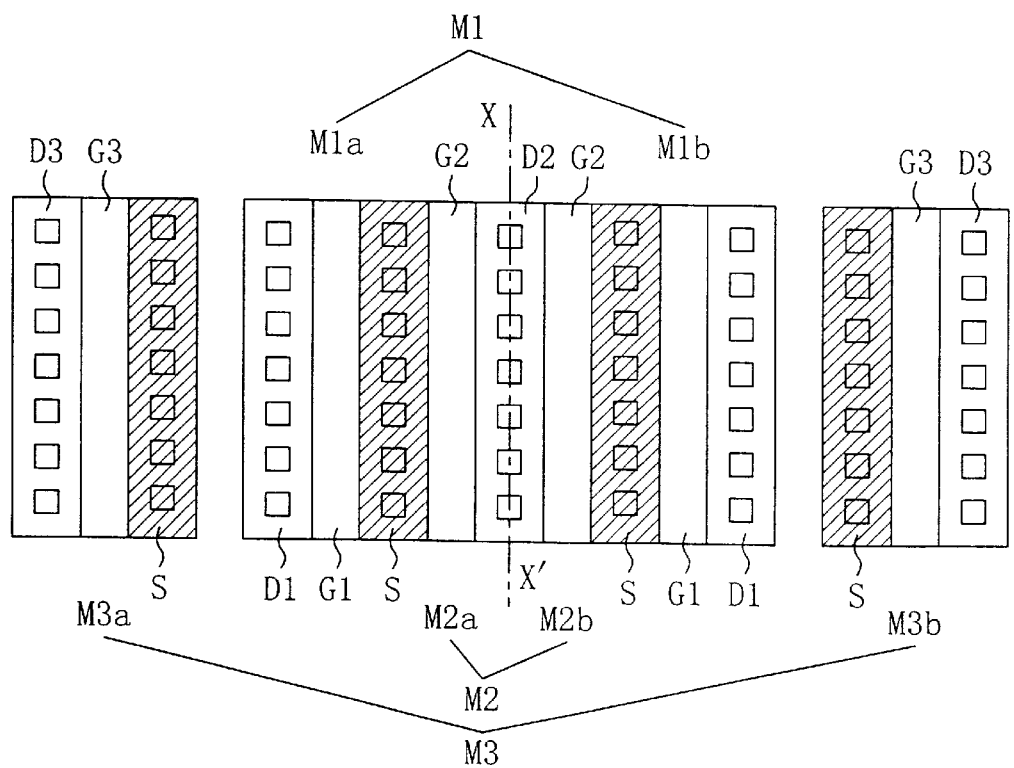
FIG. 9 illustrates a mask layout for an operational amplifier according to the third embodiment of the present invention.

Next, an operational amplifier according to the third embodiment of the present invention will be described with reference to the accompanying drawings. FIG. 9 illustrates a mask layout for the operational amplifier of the third embodiment.

In FIG. 9, the MOS transistor pair of the second embodiment shown in FIG. 4 is included in the operational amplifier. That is to say, the operational amplifier shown in FIG. 9 also includes the MOS transistor pair consisting of the first and second MOS transistors as in FIG. 4. The configuration of this MOS transistor pair and the layout of the divided transistors are the same as those shown in FIG. 4, and the description thereof will be omitted herein.

The operational amplifier shown in FIG. 9 further includes a third MOS transistor M3, which is placed on the same board as the first and second MOS transistors M1 and M2. These MOS transistor pairs construct a current mirror circuit and the third MOS transistor M3 functions as an output transistor. The third MOS transistor M3 is also made up of two equally divided transistors (i.e., a third group of divided transistors) M3a and M3b with an equal gate width. One divided transistor M3a is placed on the left of the divided transistor M1a of the first MOS transistor M1, while the to other divided transistor M3b is placed on the right of the divided transistor M1b of the first MOS transistor M1. These divided transistors M3a and M3b are placed symmetrically about the centerline X–X' to be away therefrom by the same distance in the gate longitudinal direction. Accordingly, the sum of respective coordinates of the gates of these divided transistors M3a and M3b along the length thereof is zero.

Figure 8:
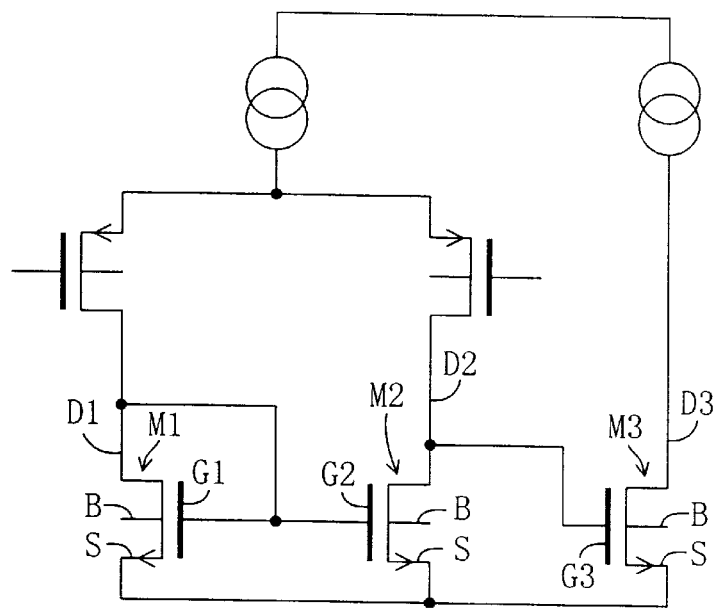
FIG. 8 illustrates an exemplary operational amplifier.

FIG. 8 illustrates an equivalent circuit of a known operational amplifier. To reduce an offset in the operational amplifier shown in FIG. 8, the characteristics of the first and second MOS transistors M1 and M2, constructing an MOS transistor pair, or a current mirror circuit, must be equalized with each other. In addition, the characteristics of the second MOS transistor M2 and the output transistor M3 must be equalized with each other, too. A layout for the three MOS transistors M1 through M3 shown in FIG. 8 is exemplified as that for the operational amplifier shown in FIG. 9.

The current difference DId between the first and second MOS transistors M1 and M2 included in the operational amplifier shown in FIG. 9 is calculated as:

$$DId=Idd[\{(0.5DL-0.5DL)+(1.5DL-1.5DL)\}/L]=0$$

Thus, the current difference can be totally eliminated.

Furthermore, the current difference DId between the first and third MOS transistors M1 and M3 and the current difference DId between the second and third MOS transistors M2 and M3 are calculated as:

$$DId=Idd[\{(3.5DL-3.5DL)-(1.5DL-1.5DL)\}/L]=0$$

$$DId=Idd[\{(3.5DL-3.5DL)-(0.5DL-0.5DL)\}/L]=0$$

Accordingly, the current difference can also be eliminated with the third MOS transistor, too.

Thus, an operational amplifier can be formed with offset reduced and with an adequate balance maintained in output current among these three MOS transistors M1, M2 and M3.

Figure 6:
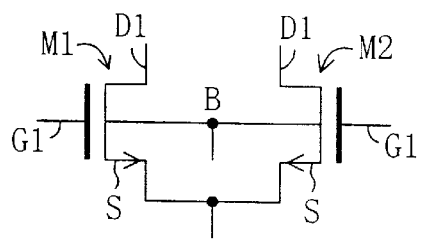
FIG. 6 illustrates an exemplary differential MOS transistor pair.
Figure 7:
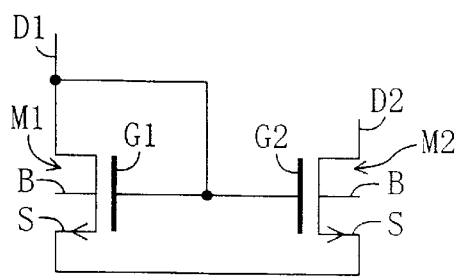
FIG. 7 illustrates an exemplary current mirror MOS transistor pair.

In the foregoing description, n-channel MOS transistors are used as shown in FIGS. 6 through 8. Alternatively, the first through third MOS transistors M1 through M3 may be naturally implemented as p-channel MOS transistors.

What is claimed is:

1. A composite MOS transistor device comprising at least a pair of MOS transistors, the MOS transistor pair having almost equal gate lengths comprising first and second MOS transistors placed in a row to the gate longitudinal direction on the same board,
   wherein the first and second MOS transistors are made up of first and second groups of divided transistors of almost equal gate lengths, respectively,
   wherein the divided transistors of the first group are arranged in said row in the gate longitudinal direction and the divided transistors of the second group are aldo arranged in the same one row as the divided transistors of the first group; and wherein the first and second MOS transistors are arranged such that each sum of coordinates of respective gates are zero in the first and second groups of divided transistors when measured from a predetermined reference coordinate along the gate longitudinal direction.

2. The device of claim 1, wherein the divided transistors of the first group are arranged to alternate with the divided transistors of the second group.

3. The device of claim 1, wherein the divided transistors of the first and second groups are arranged symmetrically about the same line to form the first and second MOS transistors, respectively.

4. The device of claim 1, wherein a divided transistor belonging to the first or second group shares a source in common with another divided transistor, which is placed adjacent to the former divided transistor and belongs to the first or second group.

5. The device of claim 1, wherein a divided transistor belonging to the first or second group shares a drain in common with another divided transistor, which is placed adjacent to the former divided transistor and belongs to the first or second group.

6. A composite MOS transistor device comprising:

an MOS transistor pair including first and second MOS transistors placed in a row to the gate longitudinal direction on the same board and constructing a current mirror circuit; and a third MOS transistor functioning as an output transistor placed in said row to the gate longitudinal direction on the same board, wherein the first, second and third MOS transistors are made up of first, second and third groups of divided transistors of almost equal gate lengths, respectively, wherein the divided transistors of the first group are arranged in said row in the gate longitudinal direction and the divided transistors of the second and third groups are also arranged in the same one row as the divided transistors of the first group; and wherein the first, second and third MOS transistors are arranged such that each sum of coordinates of respective gates are zero in the first, second and third groups of divided transistors when measured from a predetermined reference coordinate along the gate longitudinal direction.

7. The device of claim 6, wherein the divided transistors of the first, second and third groups are arranged symmetrically about the same line to form the first, second and third MOS transistors, respectively.

8. The device of claim 6, wherein the first, second and third groups of divided transistors are formed by respectively dividing the first, second and third MOS transistors into equal parts such that each said part of the first, second and third MOS transistors has an equal gate width.

9. The device of claim 6, wherein a divided transistor belonging to the first, second or third group shares a source in common with another divided transistor, which is placed adjacent to the former divided transistor and belongs to the first, second or third group.

10. The device of claim 6, wherein a divided transistor belonging to the first, second or third group shares a drain in common with another divided transistor, which is placed adjacent to the former divided transistor and belongs to the first, second or third group.

* * * * *